(12) United States Patent  
Takao

(10) Patent No.: US 10,505,529 B1
(45) Date of Patent: Dec. 10, 2019

(54) SWITCHING DEVICE, POWER CONVERTER DEVICE, CONTROL APPARATUS, AND COMPUTER PROGRAM PRODUCT

(71) Applicant: KABUSHIKI KAISHA TOSHIBA, Minato-ku (JP)

(72) Inventor: Kazuto Takao, Tsukuba (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/287,612

(22) Filed: Feb. 27, 2019

(30) Foreign Application Priority Data

Sep. 4, 2018 (JP) .................................. 2018-165451

(51) Int. Cl.
| | |
|---|---|
| H03K 3/00 | (2006.01) |
| H03K 17/082 | (2006.01) |
| H03K 3/012 | (2006.01) |
| H02P 27/06 | (2006.01) |

(52) U.S. Cl.
CPC ......... H03K 17/0822 (2013.01); H03K 3/012 (2013.01); H02P 27/06 (2013.01)

(58) Field of Classification Search
None
See application file for complete search history.

(56) References Cited

U.S. PATENT DOCUMENTS

| | | | |
|---|---|---|---|
| 6,384,552 B2 * | 5/2002 | Shimane | ................ B60L 50/51 318/139 |
| 7,434,179 B2 | 10/2008 | Hayashi | |
| 9,500,678 B2 * | 11/2016 | Williams | .......... H01L 23/49575 |

(Continued)

FOREIGN PATENT DOCUMENTS

| | | |
|---|---|---|
| EP | 2 579 172 A1 | 4/2013 |
| JP | 2001-169407 | 6/2001 |

(Continued)

OTHER PUBLICATIONS

Koutarou Miyazaki, et al., "Automatic Optimization of IGBT Gate Driving Waveform Using Simulated Annealing for Programmable Gate Driver IC", 2016 IEEE Energy Conversion Congress and Exposition (ECCE), 6 pages.

(Continued)

*Primary Examiner* — Lincoln D Donovan
*Assistant Examiner* — Khareem E Almo
(74) *Attorney, Agent, or Firm* — Oblon, McClelland, Maier & Neustadt, L.L.P.

(57) ABSTRACT

According to an embodiment, a switching device includes: a switching control unit that connects a first resistor between an input terminal for receiving the switching signal and a gate of a switching transistor during a first period that is an anterior half of a turn-off period of the switching transistor, and connects a second resistor between the input terminal and the gate during a second period that is a posterior half of the turn-off period; a calculating unit that calculates a first gate resistance based on a target voltage rising rate and a first operational expression, and that calculates a second gate resistance based on the permissible maximum voltage value and a second operational expression; and a resistance setting unit that sets resistances of the first resistor and the second resistor based on the first gate resistance and the second gate resistance.

18 Claims, 14 Drawing Sheets

(56) References Cited

U.S. PATENT DOCUMENTS

| | | | | |
|---|---|---|---|---|
| 9,780,763 | B1* | 10/2017 | Lu | H02M 3/156 |
| 10,081,253 | B2* | 9/2018 | Fukuta | B60L 11/18 |
| 2014/0307495 | A1* | 10/2014 | Fukuta | H02H 3/08 |
| | | | | 363/98 |
| 2017/0230041 | A1* | 8/2017 | Kato | H01L 21/78 |
| 2017/0302271 | A1* | 10/2017 | Kato | G11C 7/06 |
| 2019/0044505 | A1* | 2/2019 | Yabuzaki | G01R 19/252 |

FOREIGN PATENT DOCUMENTS

| | | |
|---|---|---|
| JP | 2006-156531 | 6/2006 |
| JP | 2011-253434 | 12/2011 |

OTHER PUBLICATIONS

K. Takao, et al, "Novel exact power loss design method for high output power density converter", PESC 2006, 5 pages.

\* cited by examiner

→ TIME

US 10,505,529 B1

SWITCHING DEVICE, POWER CONVERTER DEVICE, CONTROL APPARATUS, AND COMPUTER PROGRAM PRODUCT

CROSS-REFERENCE TO RELATED APPLICATIONS

This application is based upon and claims the benefit of priority from Japanese Patent Application No. 2018-165451, filed on Sep. 4, 2018; the entire contents of which are incorporated herein by reference.

FIELD

Embodiments described herein relate generally to a switching device, a power converter device, a control apparatus, and a computer program product.

BACKGROUND

An inverter or the like for driving a motor of a vehicle is provided with a field effect transistor (FET) for switching a high voltage. In such an FET, when the resistance of a gate resistor is increased, a surge voltage generated in a turn-off period in which the FET transits from on to off is suppressed. However, because an increase in the resistance of the gate resistor also results in an extended length of the turn-off period, the switching speed drops, and the power loss is increased. By contrast, when the resistance of the gate resistor of the FET is reduced, the length of the turn-off period is reduced, and, as a result, the switching speed increases, and the power loss can be reduced. However, the surge voltage generated in the turn-off period becomes higher, and, as a result, problems such as an increased noise or a breakdown of the FET may occur.

To solve such problems, a technique for providing a switching control unit for switching a resistance of the gate resistor in the FET during a turn-off period has been known. For example, such a switching control unit decreases the resistance of the gate resistor during a period from when the switching is started to when the drain voltage reaches the power supply voltage, and brings up the resistance of the gate resistor after the drain voltage reaches the power supply voltage and a drain current starts flowing. In this manner, the power loss and the surge voltage of the FET are both suppressed.

Furthermore, the switching control unit may also switch the resistance of the gate resistor during a turn-on period in which a transition from the off state to the on state takes place, in the same manner as in the turn-off period. In this manner, the power loss and the current overshoot in the FET are both suppressed.

An appropriate resistance of the gate resistor differs depending on a target switching speed and a permissible surge voltage (or current overshoot). The appropriate resistance of the gate resistor also differs depending on a load current that is to be output from the FET to the load. Therefore, neither the power loss nor the surge voltage (or the current overshoot) of the FET can be suppressed unless the gate resistor is set to an appropriate resistance.

However, the target switching speed and the permissible surge voltage (or current overshoot) differ depending on the FET type and the circuit in which the FET is used. Furthermore, the load current that is output from the FET to the load varies depending on conditions of the load. Furthermore, the power supply voltage, the gate driving voltage, and the like also differ depending on the circuit in which the FET is used.

Therefore, when the technology for switching the resistance of the gate resistor during a turn-off period or a turn-on period in the FET is used, it has been necessary to set the resistance of the gate resistor to an appropriate value using a simple structure, in a manner suitable for the FET type, circuit settings, ambient conditions surrounding the device, and the like.

DETAILED DESCRIPTION

According to an embodiment, a switching device includes a switching transistor, a gate resistor unit, a switching control unit, a target value acquiring unit, a calculating unit, and a resistance setting unit. The switching transistor is switched on and off in response to a switching signal. The gate resistor unit includes a first resistor and a second resistor each of which has a variable resistance. The switching control unit connects the first resistor between an input terminal for receiving the switching signal and a gate of the switching transistor during a first period that is an anterior half of a turn-off period of the switching transistor, and connects the second resistor between the input terminal and the gate during a second period that is a posterior half of the turn-off period. The target value acquiring unit acquires a target voltage rising rate and a permissible maximum voltage value of the switching transistor. The calculating unit that calculates a first gate resistance that is a resistance between the input terminal and the gate for the first period based on the target voltage rising rate and a first operational expression, and that calculates a second gate resistance that is a resistance between the input terminal and the gate for the second period based on the permissible maximum voltage value and a second operational expression. The resistance setting unit that sets resistances of the first resistor and the second resistor based on the first gate resistance and the second gate resistance.

A motor system 10 according to one embodiment will now be explained in detail with reference to some drawings. This motor system 10 can set an appropriate resistance to a gate resistor with a simple structure, and perform high-speed switching efficiently.

Figure 1:
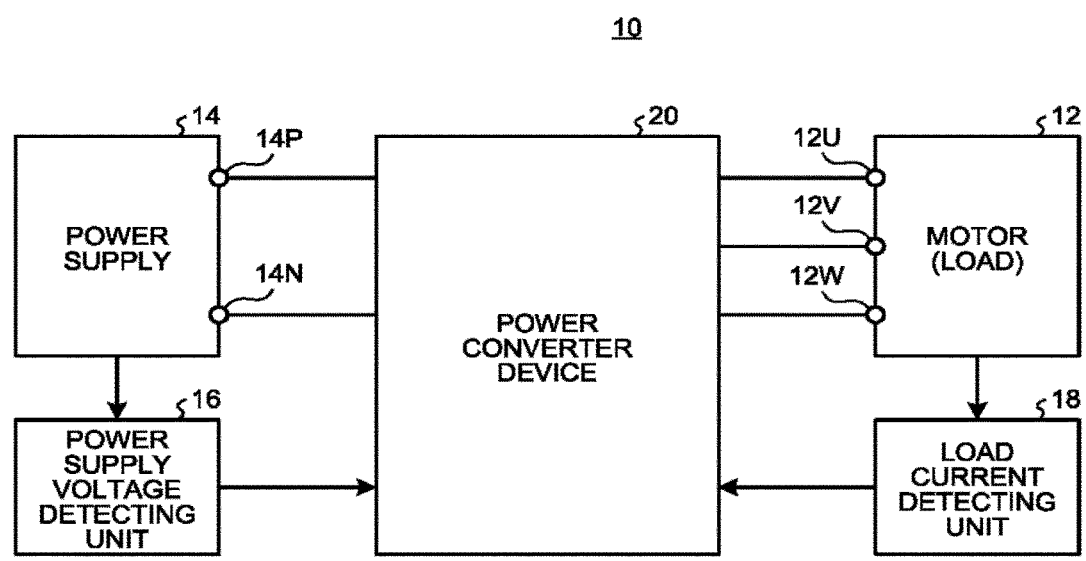
FIG. 1 is a schematic of a configuration of a motor system according to an embodiment.

FIG. 1 is a schematic illustrating a configuration of the motor system 10 according to the embodiment. The motor system 10 includes a motor 12, a power supply 14, a power supply voltage detecting unit 16, a load current detecting unit 18, and a power converter device 20.

The motor 12 is one example of a load. In this embodiment, the motor 12 is a three-phase motor, and includes a U-phase terminal 12U, a V-phase terminal 12V, and a W-phase terminal 12W. Applied to the motor 12 is a three-phased driving voltage for rotating the rotational shaft with respect to the U-phase terminal 12U, the V-phase terminal 12V, and the W-phase terminal 12W.

The power supply 14 generates DC power. The power supply 14 includes a positive-side terminal 14P and a negative-side terminal 14N. The power supply 14 outputs a positive-side power supply voltage from the positive-side terminal 14P. The power supply 14 outputs a negative-side power supply voltage or 0 volts from the negative-side terminal 14N.

The power supply voltage detecting unit 16 detects a voltage value of a power supply voltage generated by the power supply 14. The load current detecting unit 18 detects a current value of a load current to be supplied to the motor 12.

The power converter device 20 receives DC power from the power supply 14, performs power conversion, and supplies AC power to the motor 12, which is the load. In this embodiment, the power converter device 20 converts the DC power received from the power supply 14 into three-phased AC power, and supplies the resultant three-phased AC voltage to the motor 12.

A plurality of switching transistors 50, which will be described later, are included in the power converter device 20. The power converter device 20 calculates a resistance for the gate resistor included in each of the switching transistors 50 based on the voltage value of the power supply voltage detected by the power supply voltage detecting unit 16 and the current value of the load current detected by the load current detecting unit 18, and sets the resistance to the gate resistor.

If the voltage value of the power supply voltage output from the power supply 14 is known and stable, the motor system 10 may not include the power supply voltage detecting unit 16. In such a configuration, the power converter device 20 stores therein the voltage value of the power supply voltage.

Furthermore, without limitation to the motor 12, the power converter device 20 may supply power to any type of load. For example, the power converter device 20 may supply power to a motor other than a three-phased motor, or may generate stabilized DC voltage.

Figure 2:
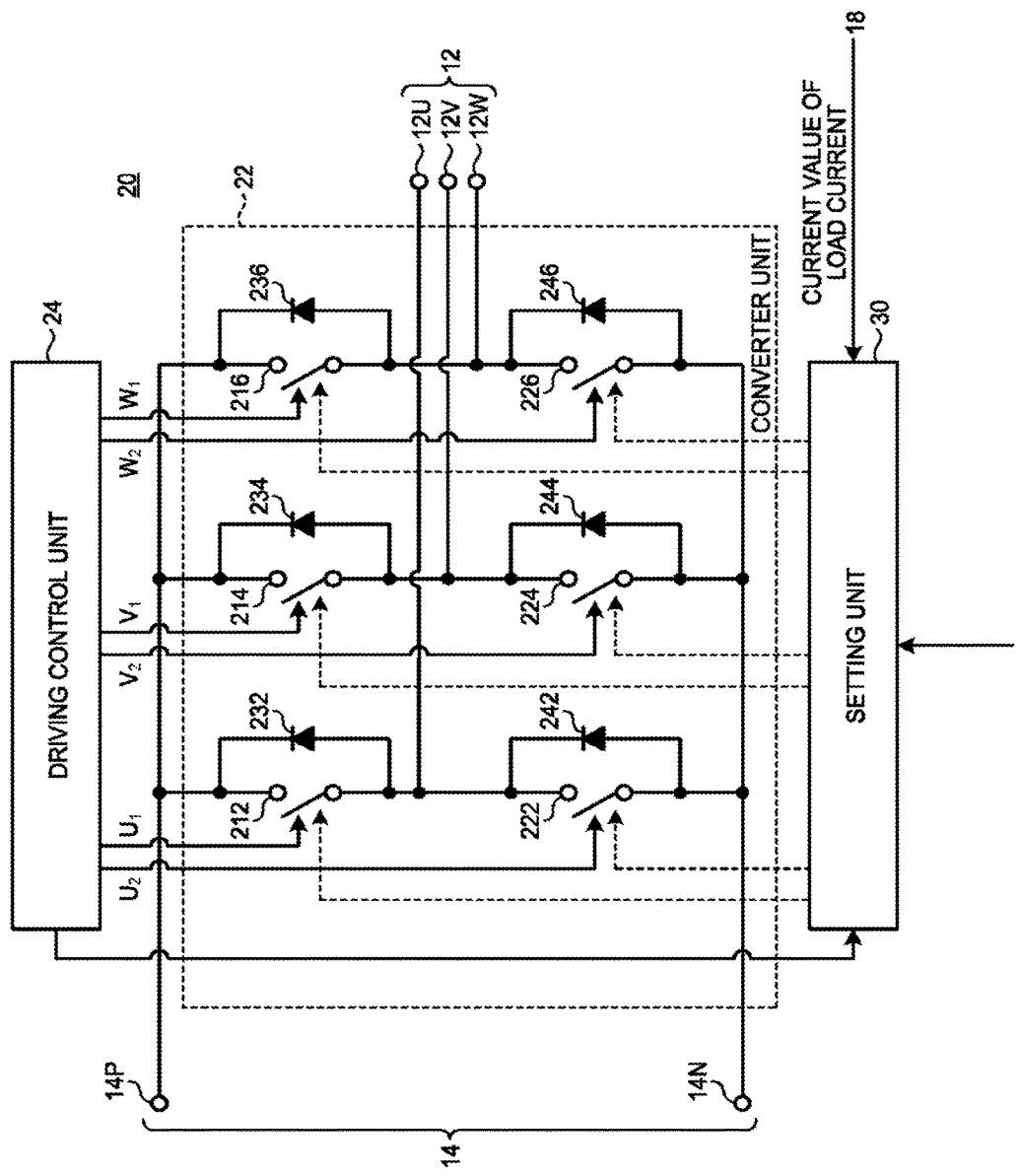
FIG. 2 is a schematic illustrating a configuration of a power converter device.

FIG. 2 is a schematic illustrating a configuration of the power converter device 20. The power converter device 20 includes a converter unit 22, a driving control unit 24, and a setting unit 30.

The converter unit 22 includes a U-phase upper-side switch unit 212, a V-phase upper-side switch unit 214, a W-phase upper-side switch unit 216, a U-phase lower-side switch unit 222, a V-phase lower-side switch unit 224, a W-phase lower-side switch unit 226, a U-phase upper-side diode 232, a V-phase upper-side diode 234, a W-phase upper-side diode 236, a U-phase lower-side diode 242, a V-phase lower-side diode 244, and a W-phase lower-side diode 246.

The U-phase upper-side switch unit 212 connects or opens the connection between the positive-side terminal 14P and the U-phase terminal 12U. The V-phase upper-side switch unit 214 connects or opens the connection between the positive-side terminal 14P and the V-phase terminal 12V. The W-phase upper-side switch unit 216 connects or opens the connection between the positive-side terminal 14P and the W-phase terminal 12W.

The U-phase lower-side switch unit 222 connects or opens the connection between the negative-side terminal 14N and the U-phase terminal 12U. The V-phase lower-side switch unit 224 connects or opens the connection between the negative-side terminal 14N and the V-phase terminal 12V. The W-phase lower-side switch unit 226 connects or opens the connection between the negative-side terminal 14N and the W-phase terminal 12W.

The switching transistors 50, which will be described later, are included in the U-phase upper-side switch unit 212, the V-phase upper-side switch unit 214, the W-phase upper-side switch unit 216, the U-phase lower-side switch unit 222, the V-phase lower-side switch unit 224, and the W-phase lower-side switch unit 226.

The U-phase upper side diode 232 has a cathode connected to the positive-side terminal 14P, and an anode connected to the U-phase terminal 12U. The V-phase upper side diode 234 has a cathode connected to the positive-side terminal 14P. The W-phase upper side diode 236 has a cathode connected to the positive-side terminal 14P, and an anode connected to the W-phase terminal 12W.

The U-phase lower-side diode 242 has an anode connected to the negative-side terminal 14N, and a cathode connected to the U-phase terminal 12U. The V-phase lower-side diode 244 has an anode connected to the negative-side terminal 14N, and a cathode connected to the V-phase terminal 12V. The W-phase lower-side diode 246 has an anode connected to the negative-side terminal 14N, and a cathode connected to the W-phase terminal 12W.

The driving control unit 24 feeds a U-phase upper side switching signal to the U-phase upper-side switch unit 212, to switch the U-phase upper-side switch unit 212 on or off. The driving control unit 24 feeds a V-phase upper side switching signal to the V-phase upper-side switch unit 214, to switch the V-phase upper-side switch unit 214 on or off. the driving control unit 24 feeds a W-phase upper side switching signal to the W-phase upper-side switch unit 216, to switch the W-phase upper-side switch unit 216 on or off.

The driving control unit 24 feeds a U-phase lower side switching signal to the U-phase lower-side switch unit 222, to switch the U-phase lower-side switch unit 222 on or off. The driving control unit 24 feeds a V-phase lower side switching signal to the V-phase lower-side switch unit 224, to switch the V-phase lower-side switch unit 224 on or off. The driving control unit 24 feeds a W-phase lower side switching signal to the W-phase lower-side switch unit 226, to switch the W-phase lower-side switch unit 226 on or off.

The setting unit 30 acquires the voltage value of the power supply voltage detected by the power supply voltage detecting unit 16, and the current value of the load current detected by the load current detecting unit 18. The setting unit 30 also acquires the voltage value of each of the switching signals from the driving control unit 24. It is possible to store the voltage value of the power supply voltage in the setting unit 30 in advance. It is also possible to store the voltage value of the voltage of each of the switching signals in the setting unit 30 in advance.

The setting unit 30 also acquires an operation target of the switching transistors 50, which will be described later, in advance, prior to the power conversion operation. The operation target will be described later in detail.

The setting unit 30 calculates the resistance of the gate resistor included in each of the switching transistors 50, which will be described later, based on the voltage value of the power supply voltage, the current value of the load current, the voltage value of the voltage of each of the switching signals, and the operation target, and sets the resistance to the gate resistor. A method for calculating the resistance of the gate resistor will be described later in detail.

Figure 3:
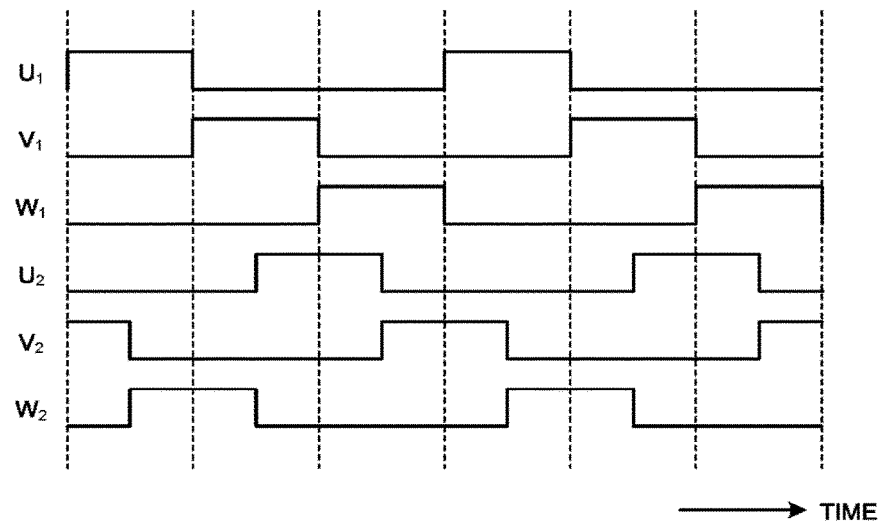
FIG. 3 is a schematic illustrating waveforms of a plurality of switching signals for driving a motor.

FIG. 3 is a schematic illustrating the waveforms of the switching signals for driving the motor 12. The driving control unit 24 generates a switching signal for the U-phase upper side, a switching signal for the V-phase upper side, a switching signal for the W-phase upper side, a switching signal for the U-phase lower side, a switching signal for the V-phase lower side, and a switching signal for the W-phase lower side, at the timing illustrated in FIG. 3, for example. With these signals, the driving control unit 24 can switch the U-phase upper-side switch unit 212, the V-phase upper-side switch unit 214, the W-phase upper-side switch unit 216, the U-phase lower-side switch unit 222, the V-phase lower-side switch unit 224, and the W-phase lower-side switch unit 226 on or off so as to drive the motor 12 in rotation. The driving control unit 24 may also be configured to generate the switching signals at the timing other than that in the pattern illustrated in FIG. 3.

Figure 4:
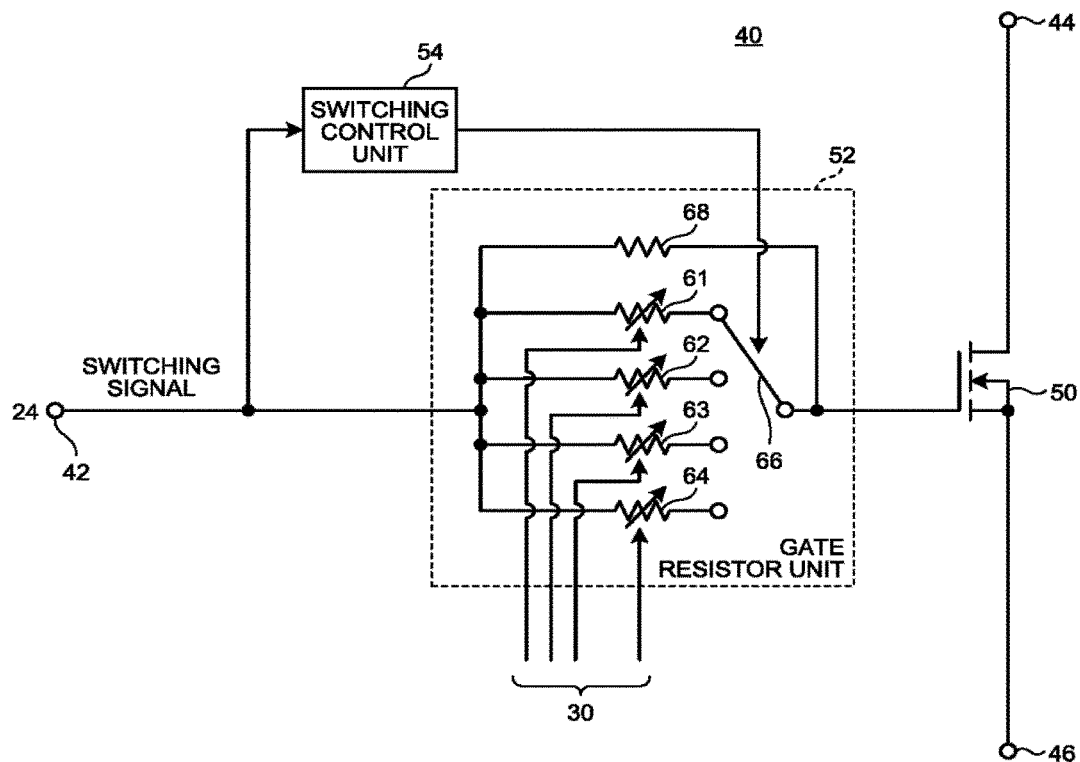
FIG. 4 is a schematic illustrating a configuration of a switch unit.

FIG. 4 is a schematic illustrating a configuration of a switch unit 40. Because the U-phase upper-side switch unit 212, the V-phase upper-side switch unit 214, the W-phase upper-side switch unit 216, the U-phase lower-side switch unit 222, the V-phase lower-side switch unit 224, and the W-phase lower-side switch unit 226 all have the same configuration, these switching units will be hereinafter collectively referred to as switch units 40. Furthermore, the switching signal for the U-phase upper side, the switching signal for the V-phase upper side, the switching signal for the W-phase upper side, the switching signal for the U-phase lower side, the switching signal for the V-phase lower side, and the switching signal for the W-phase lower side are sometimes collectively referred to as switching signals.

The switch unit 40 is provided with an input terminal 42, a drain-side terminal 44, and a source-side terminal 46. The input terminal 42 receives a switching signal from the driving control unit 24.

When the switch unit 40 is the U-phase upper-side switch unit 212, the V-phase upper-side switch unit 214, or the W-phase upper-side switch unit 216, the drain-side terminal 44 is connected to the positive-side terminal 14P of the power supply 14, and the source-side terminal 46 is connected to the U-phase terminal 12U, the V-phase terminal 12V, or the W-phase terminal 12W of the motor 12. When the switch unit 40 is the U-phase lower-side switch unit 222, the V-phase lower-side switch unit 224, or the W-phase lower-side switch unit 226, the drain-side terminal 44 is connected to the U-phase terminal 12U, the V-phase terminal 12V, or the W-phase terminal 12W of the motor 12, and the source-side terminal 46 is connected to the negative-side terminal 14N of the power supply 14. In this manner, the drain-side terminal 44 is connected to the high potential side, the source-side terminal 46 is connected to the low potential side.

The switch unit 40 includes a switching transistor 50, a gate resistor unit 52, and a switching control unit 54.

In this embodiment, the switching transistor 50 is a field-effect transistor (FET), for example. In this embodiment, the switching transistor 50 is an n-channel type metal-oxide-semiconductor field-effect transistor (MOSFET). The switching transistor 50 may also be a p-channel type MOSFET. Without limitation to an FET, the switching transistor 50 may also be an insulated gate bipolar transistor (IGBT), for example. In such a case, the drain corresponds to a collector, and the source corresponds to an emitter.

The switching transistor 50 switches the state between the drain and the source on or off depending on the voltage between the gate and the source. When the switching transistor 50 is on, the resistance between the drain and the source is ideally zero. When the switching transistor 50 is off, the resistance between the drain and the source is ideally infinite (open).

The gate of the switching transistor 50 is connected to the input terminal 42 via the gate resistor unit 52. The drain of the switching transistor 50 is connected to the drain-side terminal 44. The source of the switching transistor 50 is connected to the source-side terminal 46.

Therefore, the switching transistor 50 can connect or open the connection between the drain-side terminal 44 and the source-side terminal 46, depending on the voltage value of the switching signal voltage. When the switching transistor 50 is on, the drain-side terminal 44 and the source-side terminal 46 are connected, so that the current received from the drain-side terminal 44 can be output to the source-side terminal 46. When the switching transistor 50 is off, the drain-side terminal 44 and the source-side terminal 46 are disconnected so that the current flowing between the drain-side terminal 44 and the source-side terminal 46 is set to zero.

The gate resistor unit 52 is connected between the input terminal 42 and the gate of the switching transistor 50. The gate resistor unit 52 includes a first resistor 61, a second resistor 62, a third resistor 63, a fourth resistor 64, a selecting unit 66, and a protection resistor 68.

The resistances of the first resistor 61, the second resistor 62, the third resistor 63, and the fourth resistor 64 may be variable. The resistances of the first resistor 61, the second resistor 62, the third resistor 63, and the fourth resistor 64 are changed by the setting unit 30. For example, one ends of the first resistor 61, the second resistor 62, the third resistor 63, and the fourth resistor 64 are connected to the input terminal 42.

The selecting unit 66 connects designated one of the first resistor 61, the second resistor 62, the third resistor 63, and the fourth resistor 64, the one being designated by the switching control unit 54, between the input terminal 42 and the gate of the switching transistor 50. For example, the selecting unit 66 connects the other end, which is the end not connected with the input terminal 42, of one of the first resistor 61, the second resistor 62, the third resistor 63, and the fourth resistor 64, to the gate of the switching transistor 50.

The protection resistor 68 is connected between the input terminal 42 and the gate of the switching transistor 50. The protection resistor 68 prevents the gate of the switching transistor 50 from being open during the operation of switching to the first resistor 61, the second resistor 62, the third resistor 63, or the fourth resistor 64, for example.

The switching control unit 54 controls the timing at which the resistors are switched by the selecting unit 66. Specifically, the switching control unit 54 connects the first resistor 61 between the input terminal 42 and the gate of the switching transistor 50 during a first period $T_1$ that is an anterior half of a turn-off period in which the operation for switching the switching transistor 50 from on to off takes place. The switching control unit 54 connects the second resistor 62 between the input terminal 42 and the gate during a second period $T_2$ that is the posterior half of the turn-off period.

The switching control unit 54 connects the third resistor 63 between the input terminal 42 and the gate of the switching transistor 50 in a third period $T_3$ that is an anterior half of a turn-on period in which the operation for switching the switching transistor 50 from off to on takes place. The switching control unit 54 also connects the fourth resistor 64 between the input terminal 42 and the gate in a fourth period $T_4$ that is the posterior half of the turn-on period.

Figure 5:
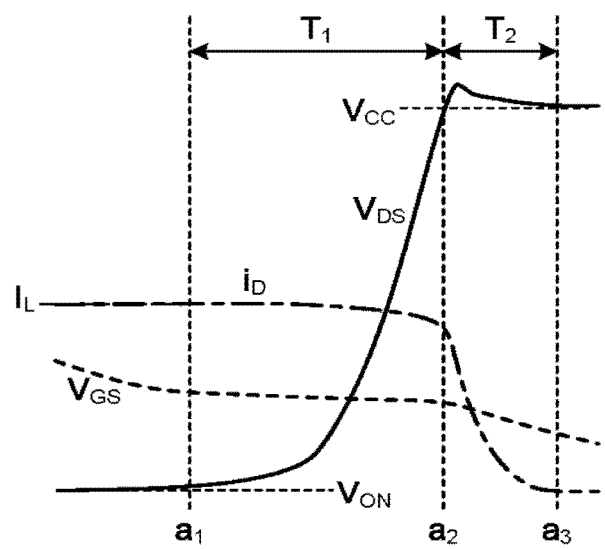
FIG. 5 is a waveform diagram of $V_{GS}$, $V_{DS}$, and $i_D$ during a turn-off period.

FIG. 5 is a schematic illustrating the waveforms of the gate-to-source voltage value ($V_{GS}$), the drain-to-source voltage ($V_{DS}$), and the drain current ($i_D$), during the turn-off period. The drain-to-source voltage value ($V_{DS}$) while the switching transistor 50 is on, is an on-time voltage ($V_{ON}$). The drain-to-source voltage value ($V_{DS}$) is at a power supply voltage value ($V_{CC}$) while the switching transistor 50 is off. $I_L$ denotes the current value of the load current flowing through the motor 12.

The switching transistor 50 transits to a turn-off state when the gate-to-source voltage value ($V_{GS}$) drops below a threshold voltage ($V_{th}$). Once the switching transistor 50 transits to the turn-off state, the drain-to-source voltage value ($V_{DS}$) rises gradually from the on-time voltage ($V_{ON}$). When the drain-to-source voltage value ($V_{DS}$) exceeds the voltage value ($V_{CC}$) of the power supply voltage, the drain current ($i_D$) rapidly starts falling.

The drain-source voltage ($V_{DS}$) keeps rising even after having exceeded the voltage value ($V_{CC}$) of the power supply voltage, and a surge is generated. After the surge recedes, the voltage value ($V_{DS}$) of the drain-to-source voltage stabilizes at the voltage value ($V_{CC}$) of the power supply voltage. After the surge recedes, the drain current ($i_D$) stabilizes at zero.

The switching control unit 54 sets, as a first period $T_1$, the period from the timing ($a_1$) at which the voltage value ($V_{DS}$) of the drain-to-source voltage starts changing to the timing ($a_2$) at which the voltage value ($V_{DS}$) of the drain-to-source voltage reaches the voltage value ($V_{CC}$) of the power supply voltage for the first time. The switching control unit 54 also sets the period from the timing ($a_2$) at which the drain-to-source voltage value ($V_{DS}$) reaches the voltage value ($V_{CC}$) of the power supply voltage for the first time to the timing ($a_3$) at which the drain-to-source voltage value ($V_{DS}$) stabilizes at the power supply voltage ($V_{CC}$) as a second period $T_2$. The switching control unit 54 then connects the first resistor 61 during the first period $T_1$, and connects the second resistor 62 during the second period $T_2$.

In other words, the switching control unit 54 switches the resistor connected between the input terminal 42 and the gate from the first resistor 61 to the second resistor 62 at the timing ($a_2$) at which the drain-to-source voltage value ($V_{DS}$) reaches the voltage value ($V_{CC}$) of the power supply voltage for the first time. For example, the switching control unit 54 compares the voltage value ($V_{GS}$) of the gate-to-source voltage of the switching transistor 50 with the voltage value ($V_{CC}$) of the power supply voltage, and detects the timing to switch ($a_2$).

Figure 6:
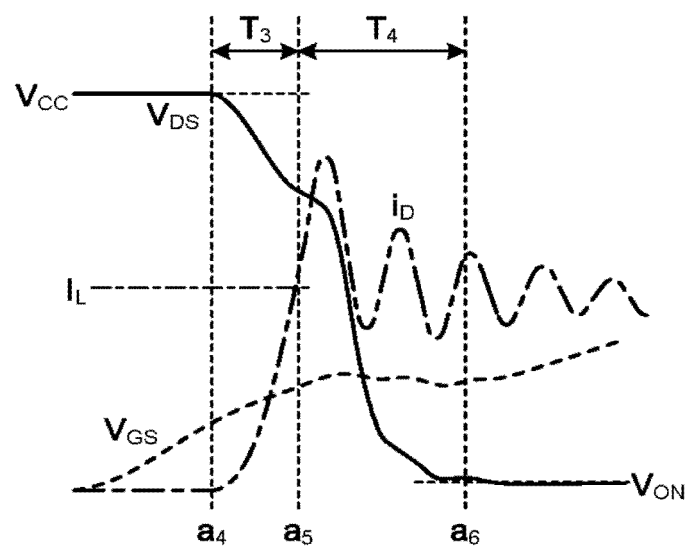
FIG. 6 is a waveform diagram of $V_GS$, $V_{DS}$, and $i_D$ during a turn-on period.

FIG. 6 is a schematic illustrating the waveforms of the voltage value ($V_GS$) of the gate-to-source voltage, the voltage value ($V_{DS}$) of the drain-to-source voltage, and the drain current ($i_D$), during the turn-on period.

When the voltage value ($V_{GS}$) of the gate-to-source voltage exceeds the threshold voltage ($V_{th}$), the switching transistor 50 transits to a turn-on state. Once the switching transistor 50 transits to the turn-on state, the current value ($i_D$) of the drain current starts changing, and gradually rises from zero. The current value ($i_D$) of the drain current then reaches the current value ($I_L$) of the load current at some timing, and overshoot occurs. The current value ($i_D$) of drain current then stabilizes at the current value ($I_L$) of the load current while repeating ringing.

Once the switching transistor 50 transits to the turn-on state, the drain-source voltage ($V_{DS}$) starts changing, and starts falling gradually from the voltage value ($V_{CC}$) of the power supply voltage. The drain-source voltage ($V_{DS}$) then stabilizes at the on-time voltage value ($V_{ON}$) at some timing.

The switching control unit 54 sets, as a third period $T_3$, the period from the timing ($a_4$) at which the drain current starts changing to the timing ($a_5$) at which the current value ($i_D$) of the drain current reaches the current value ($I_L$) of the load current for the first time. The switching control unit 54 also sets, as a fourth period $T_4$, the period from the timing ($a_5$) at which the current value ($i_D$) of the drain current reaches the current value ($I_L$) of the load current for the first time to the timing ($a_6$) at which the drain-to-source voltage ($V_{DS}$) stabilizes at the on-time voltage ($V_{CC}$). The switching control unit 54 then connects the third resistor 63 during the third period $T_3$, and connects the fourth resistor 64 during the fourth period $T_4$.

In other words, the switching control unit 54 switches the resistor connected between the input terminal 42 and the gate, from the third resistor 63 to the fourth resistor 64 at the timing ($a_5$) at which the current value ($i_D$) of the drain current reaches the current value of the load current ($I_L$) for the first time. For example, the switching control unit 54 compares the drain current ($i_D$) with the load current ($I_L$), and detects the timing to switch ($a_5$).

Figure 7:
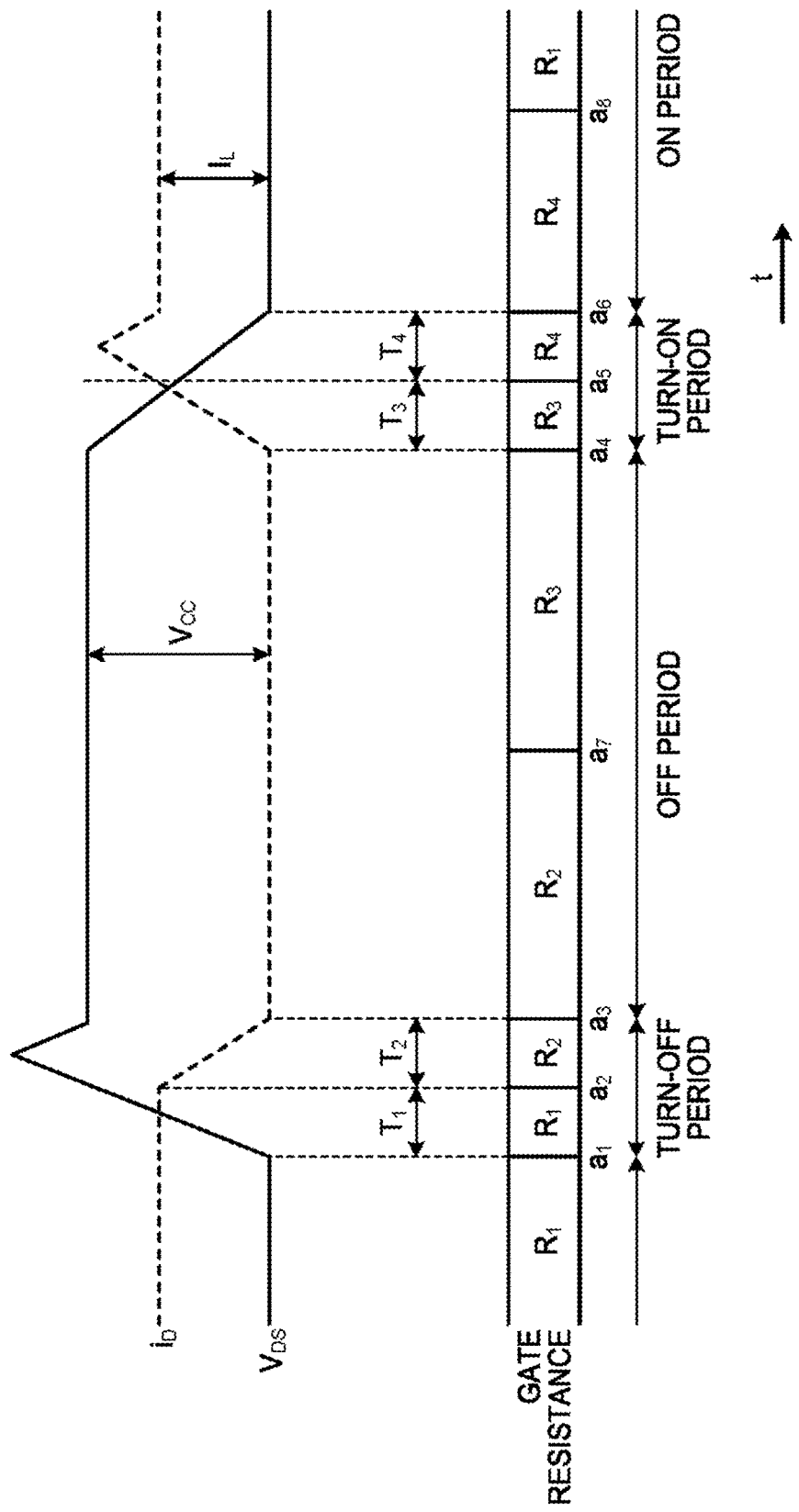
FIG. 7 is a schematic illustrating the timing for switching a gate resistor.

FIG. 7 is a schematic illustrating the timing for switching the resistances of the gate resistors.

The switching control unit 54 may connect any resistor with any resistance between the input terminal 42 and the gate of the switching transistor 50 during the off period (the period from $a_3$ to $a_4$), as long as at least the switching signal voltage is kept being applied to the gate without any problem. Therefore, the switching control unit 54 may switch the resistor connected between the input terminal 42 and the gate from the second resistor 62 to the third resistor 63 at any timing ($a_7$) during the off period. In this manner, the switching control unit 54 can have the third resistor 63 connected between the input terminal 42 and the gate in advance, before the switching transistor 50 transits to the turn-on state.

During the on period (the period from $a_6$ to $a_1$), the switching control unit 54 may connect any resistor with any resistance between the input terminal 42 and the gate of the switching transistor 50, as long as at least the switching signal voltage is kept being applied to the gate without any problem. Therefore, the switching control unit 54 may switch the resistor connected between the input terminal 42 and the gate from the fourth resistor 64 to the first resistor 61 at any timing ($a_8$) during the on period. In this manner, the switching control unit 54 can have the first resistor 61 connected between the input terminal 42 and the gate in advance, before the switching transistor 50 transits to the turn-off state.

Figure 8:
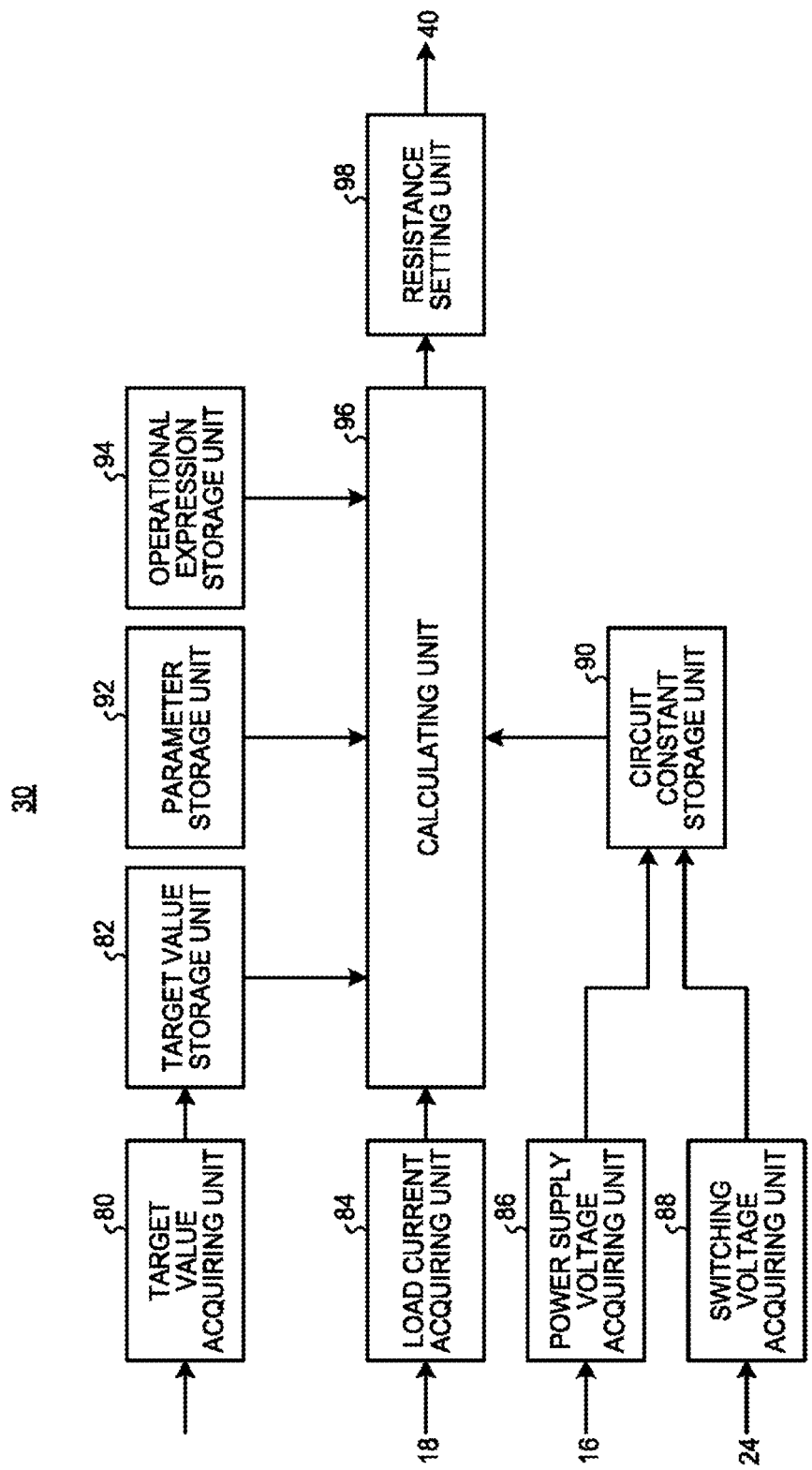
FIG. 8 is a block diagram illustrating a functional configuration of a setting unit.

FIG. 8 is a block diagram illustrating a functional configuration of the setting unit 30. The setting unit 30 includes a target value acquiring unit 80, a target value storage unit 82, a load current acquiring unit 84, a power supply voltage acquiring unit 86, a switching voltage acquiring unit 88, a circuit constant storage unit 90, a parameter storage unit 92, an operational expression storage unit 94, a calculating unit 96, and a resistance setting unit 98.

The target value acquiring unit 80 acquires an operation target of the switching transistor 50 for the turn-off and turn-on periods from an external device, prior to a power conversion operation. For example, the target value acquiring unit 80 acquires the operation target entered by a user using an external device.

Specifically, the target value acquiring unit 80 acquires a target voltage rising rate (dv/dt) and a permissible maximum voltage value ($V_{MAX}$) in the switching transistor 50 during the turn-off operation. The target voltage rising rate (dv/dt) is an amount by which the drain-to-source voltage value ($V_{DS}$) changes per unit time, in the switching transistor 50. The permissible maximum voltage value ($V_{MAX}$) is the maximum drain-to-source voltage value ($V_{DS}$) in the switching transistor 50.

The target value acquiring unit 80 also acquires a target current rising rate (di/dt) and a permissible maximum current value ($I_{MAX}$) during the turn-on operation of the switching transistor 50. The target current rising rate (di/dt) is a rate at which the current value ($i_D$) of the drain current in the switching transistor 50 changes. The permissible maximum current value ($I_{MAX}$) is the current value ($i_D$) of the maximum drain current of the switching transistor 50.

The target value storage unit 82 stores therein the operation target acquired by the target value acquiring unit 80.

The load current acquiring unit 84 acquires the load current detected by the current value ($I_L$) of the load current detecting unit 18.

The power supply voltage acquiring unit 86 acquires the voltage value ($V_{CC}$) of the power supply voltage detected by the power supply voltage detecting unit 16, and stores the acquired voltage value ($V_{CC}$) of the power supply voltage in the circuit constant storage unit 90. The voltage value ($V_{CC}$) of the power supply voltage may be stored in the circuit constant storage unit 90 in advance. In such a case, the setting unit 30 has a configuration without the power supply voltage acquiring unit 86.

The switching voltage acquiring unit 88 acquires the voltage value ($V_g$) of the switching signal from the driving control unit 24, and stores the acquired voltage value ($V_g$) of the switching signal in the circuit constant storage unit 90. The voltage value ($V_g$) of the switching signal may be stored in the circuit constant storage unit 90 in advance. In such a case, the setting unit 30 has a configuration without the switching voltage acquiring unit 88.

The circuit constant storage unit 90 stores therein various circuit constants. Specifically, the circuit constant storage unit 90 stores therein the voltage value ($V_{CC}$) of the power supply voltage and the voltage value ($V_g$) of the switching signal acquired prior to the power conversion. The circuit constant storage unit 90 also stores therein a wiring inductance (L) of a wiring through which the load current flows, and a wiring resistance (R) of the wiring through which the load current flows.

For example, a manufacturer writes the circuit constants to the circuit constant storage unit 90 at the time of factory shipment, for example. Furthermore, when the setting unit 30 is removable with respect to the converter unit 22, a user or the like may write the circuit constants to the circuit constant storage unit 90 when the converter unit 22 is connected to the setting unit 30.

The parameter storage unit 92 stores therein transistor parameters representing the characteristics of the switching transistor 50. For example, when the switching transistor 50 is an FET, the parameter storage unit 92 stores therein the threshold voltage value ($V_{th}$), a transconductance ($g_m$), a gate-to-source parasitic capacitance ($C_{gs}$), and a gate-to-drain parasitic capacitance ($C_{rss}$) of the switching transistor 50.

The manufacturer writes the transistor parameters to the parameter storage unit 92 at the time of factory shipment, for example. Furthermore, when the setting unit 30 is removable with respect to the converter unit 22, a user or the like may write the transistor parameter to the parameter storage unit 92 when the converter unit 22 is connected to the setting unit 30.

The operational expression storage unit 94 stores therein operational expressions for calculating the gate resistance for the switching transistor 50 using the operation target, the current value ($I_L$) of the load current, the voltage value ($V_{CC}$) of the power supply voltage, the voltage value ($V_g$) of the switching signal, and the various circuit constants and transistor parameters.

More specifically, the operational expression storage unit 94 stores therein a first operational expression for calculating a first gate resistance ($R_{g1}$) that is the resistance between the input terminal 42 and the gate for the first period $T_1$. The operational expression storage unit 94 also stores therein a second operational expression for calculating a second gate resistance ($R_{g2}$) that is the resistance between the input terminal 42 and the gate for the second period $T_2$. The operational expression storage unit 94 also stores therein a third operational expression for calculating a third gate resistance ($R_{g3}$) that is the resistance between the input terminal 42 and the gate for the third period $T_3$. The operational expression storage unit 94 also stores therein a fourth operational expression for calculating a fourth gate resistance ($R_{g4}$) that is the resistance between the input terminal 42 and the gate for the fourth period $T_4$.

The calculating unit 96 calculates the first gate resistance ($R_{g1}$) that is the resistance between the input terminal 42 and the gate for the first period $T_1$ based on the current value ($I_L$) of the load current acquired by the load current acquiring unit 84, the target voltage rising rate (dv/dt) stored in the target value storage unit 82, the circuit constants stored in the circuit constant storage unit 90, the transistor parameters stored in the parameter storage unit 92, and the first operational expression stored in the operational expression storage unit 94.

The calculating unit 96 calculates the second gate resistance ($R_{g2}$) that is the resistance between the input terminal 42 and the gate for the second period $T_2$ based on the current value ($I_L$) of the load current acquired by the load current acquiring unit 84, the permissible maximum voltage value ($V_{MAX}$) stored in the target value storage unit 82, the circuit constants stored in the circuit constant storage unit 90, the transistor parameters stored in the parameter storage unit 92, and the second operational expression stored in the operational expression storage unit 94.

The calculating unit 96 calculates the third gate resistance ($R_{g3}$) that is the resistance between the input terminal 42 and the gate for the third period $T_3$ based on the current value ($I_L$) of the load current acquired by the load current acquiring unit 84, the target current rising rate (di/dt) stored in the target value storage unit 82, the circuit constants stored in the circuit constant storage unit 90, the transistor parameters stored in the parameter storage unit 92, and the third operational expression stored in the operational expression storage unit 94.

The calculating unit 96 also calculates the fourth gate resistance ($R_{g4}$) that is the resistance between the input terminal 42 and the gate for the fourth period $T_4$ based on the current value ($I_L$) of the load current acquired by the load current acquiring unit 84, the permissible maximum current value ($I_{MAX}$) stored in the target value storage unit 82, the circuit constants stored in the circuit constant storage unit 90, the transistor parameters stored in the parameter storage unit 92, and the fourth operational expression stored in the operational expression storage unit 94.

The resistance setting unit 98 sets the resistance of the gate resistor unit 52 included in each of the switch units 40 in the converter unit 22. Specifically, the resistance setting unit 98 sets the resistance of the first resistor 61 based on the first gate resistance ($R_{g1}$) calculated by the calculating unit 96. The resistance setting unit 98 also sets the resistance of the second resistor 62 based on the second gate resistance ($R_{g2}$) calculated by the calculating unit 96. The resistance setting unit 98 also sets the resistance of the third resistor 63 based on the third gate resistance ($R_{g3}$) calculated by the calculating unit 96. The resistance setting unit 98 also sets the resistance of the fourth resistor 64, based on the fourth gate resistance ($R_{g4}$) calculated by the calculating unit 96.

Figure 9:
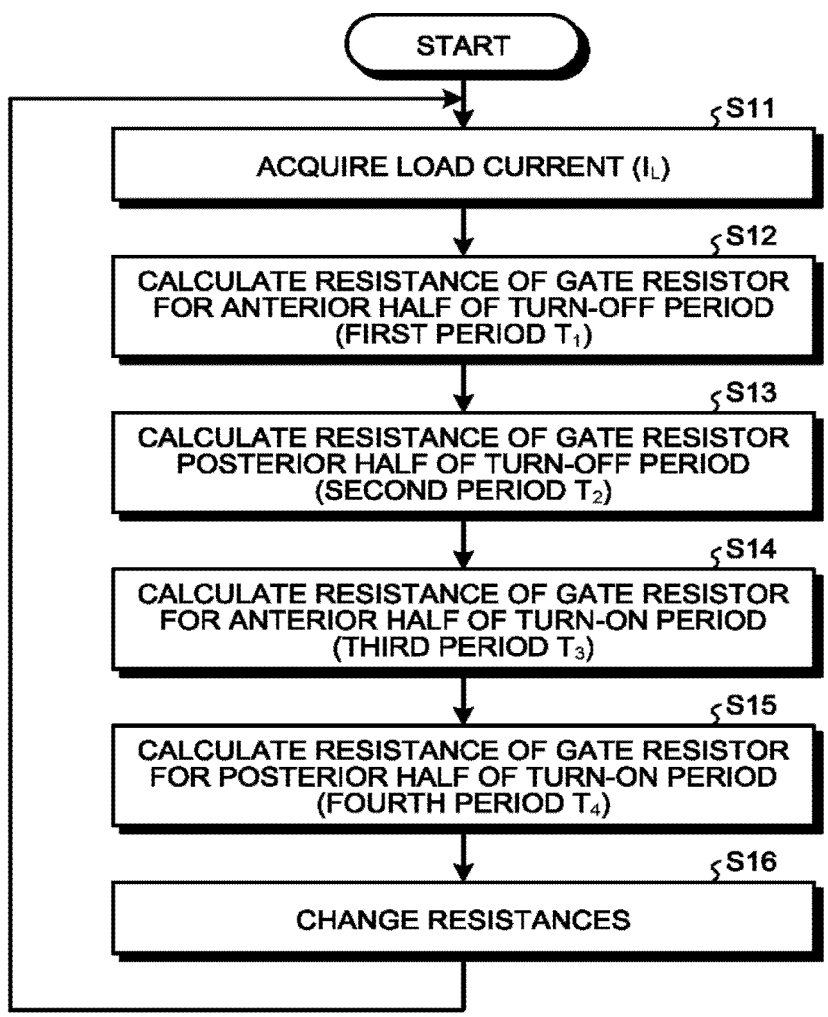
FIG. 9 is a flowchart illustrating the sequence of a process performed by the setting unit.

FIG. 9 is a flowchart illustrating the sequence of a process performed by the setting unit 30. The setting unit 30 performs the operation by following the flowchart illustrated in FIG. 9 during a power conversion operation.

To begin with, at S11, the setting unit 30 acquires the current value ($I_L$) of the load current detected by the load current detecting unit 18.

At S12, the setting unit 30 calculates the gate resistance (the first gate resistance ($R_{g1}$)) for the anterior half of the turn-off period (the first period $T_1$). The process at S12 will be explained further in detail with reference to FIG. 10.

At S13, the setting unit 30 calculates the gate resistance (the second gate resistance ($R_{g2}$)) for the posterior half of the turn-off period (the second period $T_2$). The process at S13 will be explained further in detail with reference to FIG. 11.

At S14, the setting unit 30 calculates the gate resistance (the third gate resistance ($R_{g3}$)) for the anterior half of the turn-on period (the third period $T_3$). The process at S14 will be explained further in detail with reference to FIG. 12.

At S15, the setting unit 30 calculates the gate resistance (the fourth gate resistance ($R_{g4}$)) for the posterior half of the turn-on period (the fourth period $T_4$). The process at S15 will be explained further in detail with reference to FIG. 13.

At S16, the setting unit 30 changes the resistance of the first resistor 61 based on the first gate resistance ($R_{g1}$). The setting unit 30 changes the resistance of the second resistor 62 based on the second gate resistance ($R_{g2}$). The setting unit 30 changes the resistance of the third resistor 63 based on the third gate resistance ($R_{g3}$). The setting unit 30 changes the resistance of the fourth resistor 64 based on the fourth gate resistance ($R_{g4}$).

Once the process at S16 is finished, the setting unit 30 repeats the process from S11 after a certain period elapses. The setting unit 30 repeats the process between S11 and S16 until the power conversion operation is completed. In this manner, the setting unit 30 can set the gate resistance of the switching transistor 50 to an appropriate value depending on the current value ($I_L$) of the load current.

Figure 10:
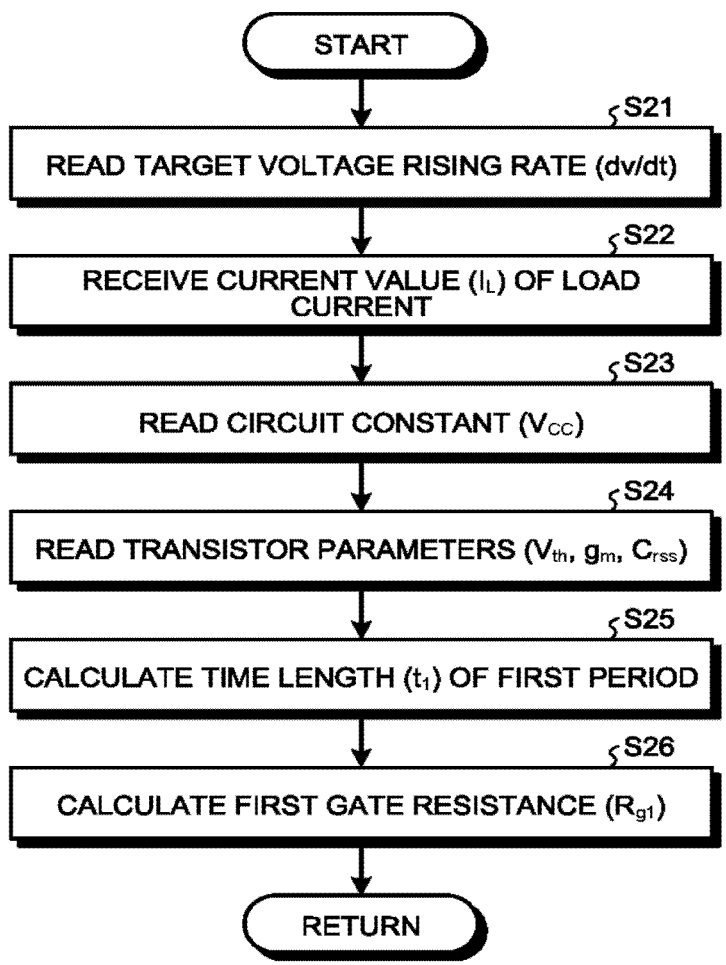
FIG. 10 is a schematic illustrating the sequence of a process for calculating the resistance of the gate resistor for a first period.

FIG. 10 is a flowchart illustrating the sequence of a process for calculating the gate resistance ($R_{g1}$) for the anterior half of the turn-off period (the first period $T_1$). The calculating unit 96 included in the setting unit 30 performs the process illustrated in FIG. 10 at S12 in FIG. 9.

To begin with, at S21, the calculating unit 96 reads the target voltage rising rate (dv/dt) from the target value storage unit 82. At S22, the calculating unit 96 receives the current value ($I_L$) of the load current from the load current acquiring unit 84. At S23, the calculating unit 96 reads the voltage value ($V_{CC}$) of the power supply voltage from the circuit constant storage unit 90. At S24, the calculating unit 96 reads the threshold voltage value ($V_{th}$), the transconductance ($g_m$), and the gate-to-drain parasitic capacitance ($C_{rss}$) from the parameter storage unit 92.

At S25, the calculating unit 96 calculates a time length ($t_1$) of the first period $T_1$ based on the target voltage rising rate (dv/dt) and the voltage value ($V_{CC}$) of the power supply voltage. Specifically, the calculating unit 96 calculates Expression (11) below:

$$t_1 = V_{CC}/(dv/dt) \tag{11}$$

At S26, the calculating unit 96 calculates the first gate resistance ($R_{g1}$) based on the time length ($t_1$) of the first period $T_1$, the load current ($I_L$), the voltage value ($V_{CC}$) of the power supply voltage, the threshold voltage value ($V_{th}$), the transconductance ($g_m$), and the gate-to-drain parasitic capacitance ($C_{rss}$). Specifically, the calculating unit 96 calculates the first gate resistance ($R_{g1}$) based on Expression (12) below:

$$R_{g1} = t_1 \cdot \frac{(I_L/g_m + V_{th})}{C_{rss} \cdot V_{CC}} \tag{12}$$

Expression (12) is derived from an expression modelling the MOSFET operation.

The calculating unit 96 ends this sequence once the process at S26 is finished. Through the process described above, the calculating unit 96 can calculate the gate resistance ($R_{g1}$) for the anterior half of the turn-off period (the first period $T_1$).

Figure 11:
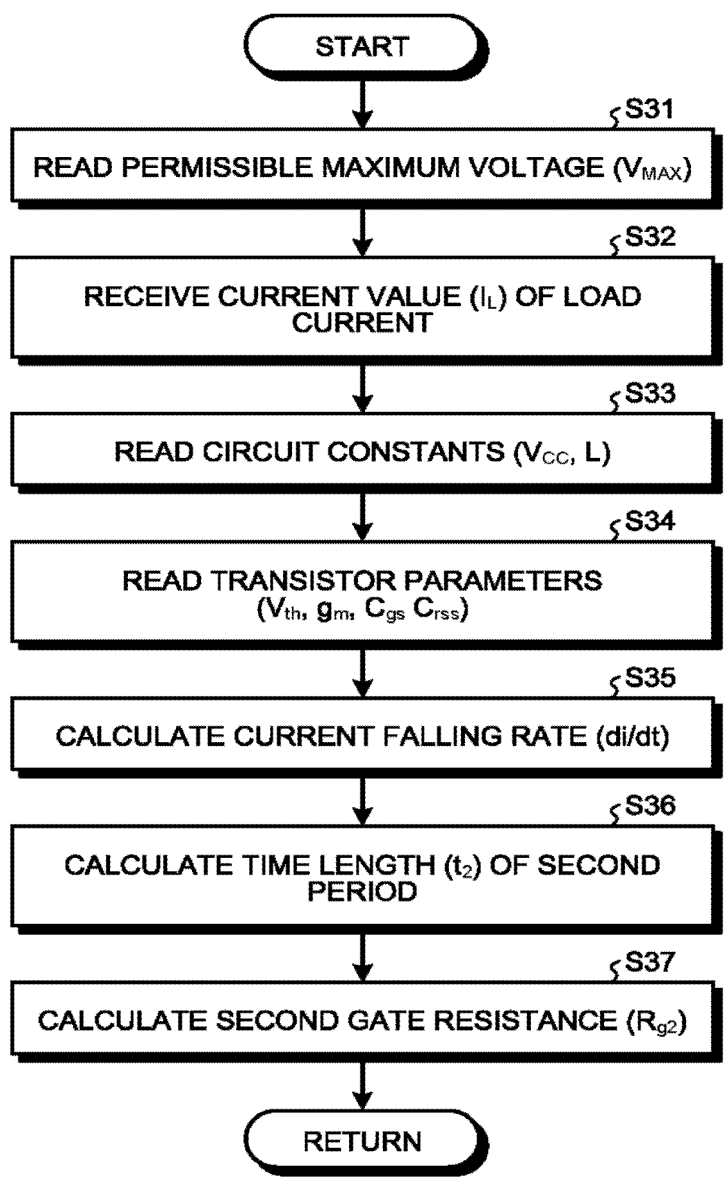
FIG. 11 is a schematic illustrating the sequence of a process for calculating the resistance of the gate resistor for a second period.

FIG. 11 is a flowchart illustrating the sequence of a process for calculating the gate resistance ($R_{g2}$) for the posterior half of the turn-off period (the second period $T_2$). The calculating unit 96 in the setting unit 30 performs the process illustrated in FIG. 11 at S13 in FIG. 9.

To begin with, at S31, the calculating unit 96 reads the permissible maximum voltage value ($V_{MAX}$) from the target value storage unit 82. At S32, the calculating unit 96 receives the current value ($I_L$) of the load current from the load current acquiring unit 84. At S33, the calculating unit 96 reads the voltage value ($V_{CC}$) of the power supply voltage and the wiring inductance (L) from the circuit constant storage unit 90. At S34, the calculating unit 96 reads the threshold voltage ($V_{th}$), the transconductance ($g_m$), the gate-to-source parasitic capacitance ($C_{gs}$), and the gate-to-drain parasitic capacitance ($C_{rss}$) from the parameter storage unit 92.

At S35, the calculating unit 96 calculates a current falling rate (di/dt) based on the permissible maximum voltage value ($V_{MAX}$), the voltage value ($V_{CC}$) of the power supply voltage, and the wiring inductance (L). The current falling rate (di/dt) is an amount by which the drain current ($i_D$) changes per unit time. Specifically, the calculating unit 96 calculates Expression (13) below:

$$di/dt = (V_{MAX} - V_{CC})/L \qquad (13)$$

At S36, the calculating unit 96 calculates a time length ($t_2$) of the second period $T_2$ based on the current value ($I_L$) of the load current and the current falling rate (di/dt). Specifically, the calculating unit 96 calculates Expression (14) below:

$$t_2 = I_L/(di/dt) \qquad (14)$$

At S37, the calculating unit 96 calculates the second gate resistance ($R_{g2}$) based on the time length ($t_2$) of the second period $T_2$, the current value ($I_L$) of the load current, the voltage value ($V_{th}$) of the threshold voltage, the transconductance ($g_m$), the gate-to-source parasitic capacitance ($C_{gs}$), and the gate-to-drain parasitic capacitance ($C_{rss}$). Specifically, the calculating unit 96 calculates the second gate resistance ($R_{g2}$) based on Expression (15) below:

$$R_{g2} = t_2 \cdot \frac{1}{(C_{gs} + C_{rss}) \cdot \ln\left(\frac{I_L}{g_m \cdot V_{th}} + 1\right)} \qquad (15)$$

Expression (15) is derived from an expression modelling the MOSFET operation.

The calculating unit 96 ends this sequence once the process at S37 is finished. Through the process described above, the calculating unit 96 can calculate the gate resistance ($R_{g2}$) for the posterior half of the turn-off period (the second period $T_2$).

Figure 12:
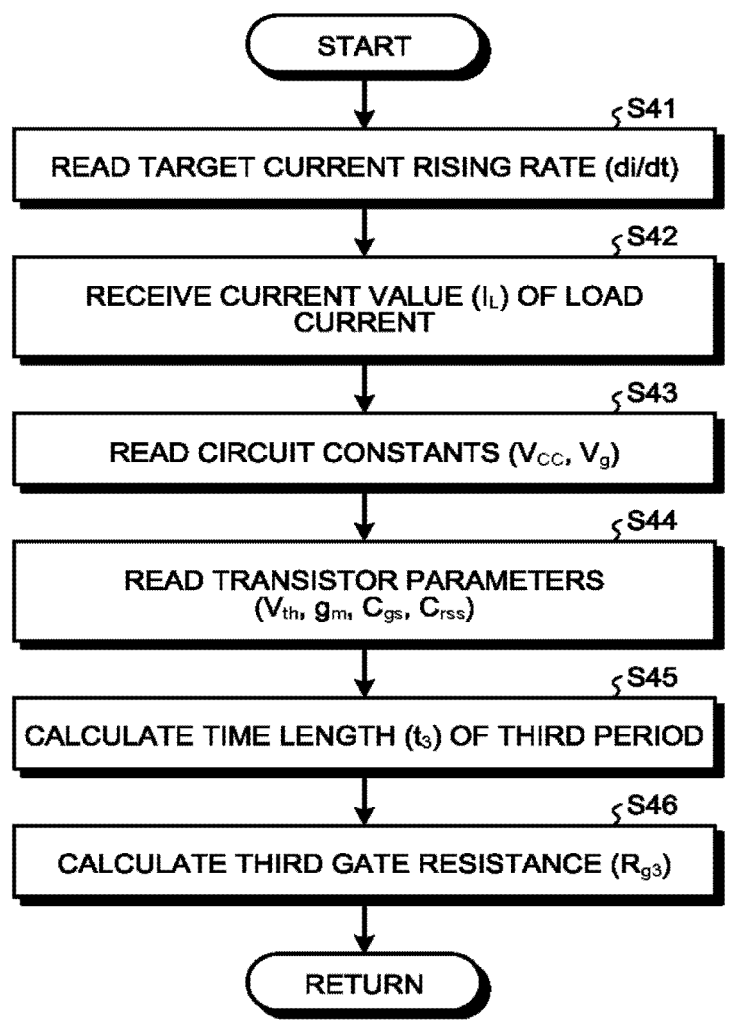
FIG. 12 is a schematic illustrating the sequence of a process for calculating the resistance of the gate resistor for a third period.

FIG. 12 is a flowchart illustrating the sequence of a process for calculating the gate resistance ($R_{g3}$) for the anterior half of the turn-on period (the third period $T_3$). The calculating unit 96 in the setting unit 30 performs the process illustrated in FIG. 12 at S14 in FIG. 9.

To begin with, at S41, the calculating unit 96 reads the target current rising rate (di/dt) from the target value storage unit 82. At S42, the calculating unit 96 receives the current value ($I_L$) of the load current from the load current acquiring unit 84. At S43, the calculating unit 96 reads the voltage value ($V_{CC}$) of the power supply voltage and the voltage value ($V_g$) of the switching signal from the circuit constant storage unit 90. At S44, the calculating unit 96 reads the threshold voltage value ($V_{th}$), the transconductance ($g_m$), the gate-to-source parasitic capacitance ($C_{gs}$), and the gate-to-drain parasitic capacitance ($C_{rss}$) from the parameter storage unit 92.

At S45, the calculating unit 96 calculates a time length ($t_3$) of the third period $T_3$ based on the target current rising rate (di/dt) and the current value ($I_L$) of the load current. Specifically, the calculating unit 96 calculates Expression (16) below:

$$t_3 = I_L/(di/dt) \qquad (16)$$

At S46, the calculating unit 96 calculates the third gate resistance ($R_{g3}$) based on the time length ($t_3$) of the third period $T_3$, the load current ($I_L$), the voltage value ($V_g$) of the switching signal voltage, the threshold voltage value ($V_{th}$), the transconductance ($g_m$), the gate-to-source parasitic capacitance ($C_{gs}$), and the gate-to-drain parasitic capacitance ($C_{rss}$). Specifically, the calculating unit 96 calculates the third gate resistance ($R_{g3}$) based on Expression (17) below:

$$R_{g3} = t_3 \cdot \frac{1}{(C_{gs} + C_{rss}) \cdot \ln\left(\frac{g_m \cdot V_g}{g_m \cdot (V_g - V_{th}) - I_L}\right)} \qquad (17)$$

Expression (17) is derived from an expression modelling the MOSFET operation.

The calculating unit 96 ends this sequence once the process at S46 is finished. Through the process described above, the calculating unit 96 can calculate the gate resistance ($R_{g3}$) for the anterior half of the turn-on period (the third period $T_3$).

Figure 13:
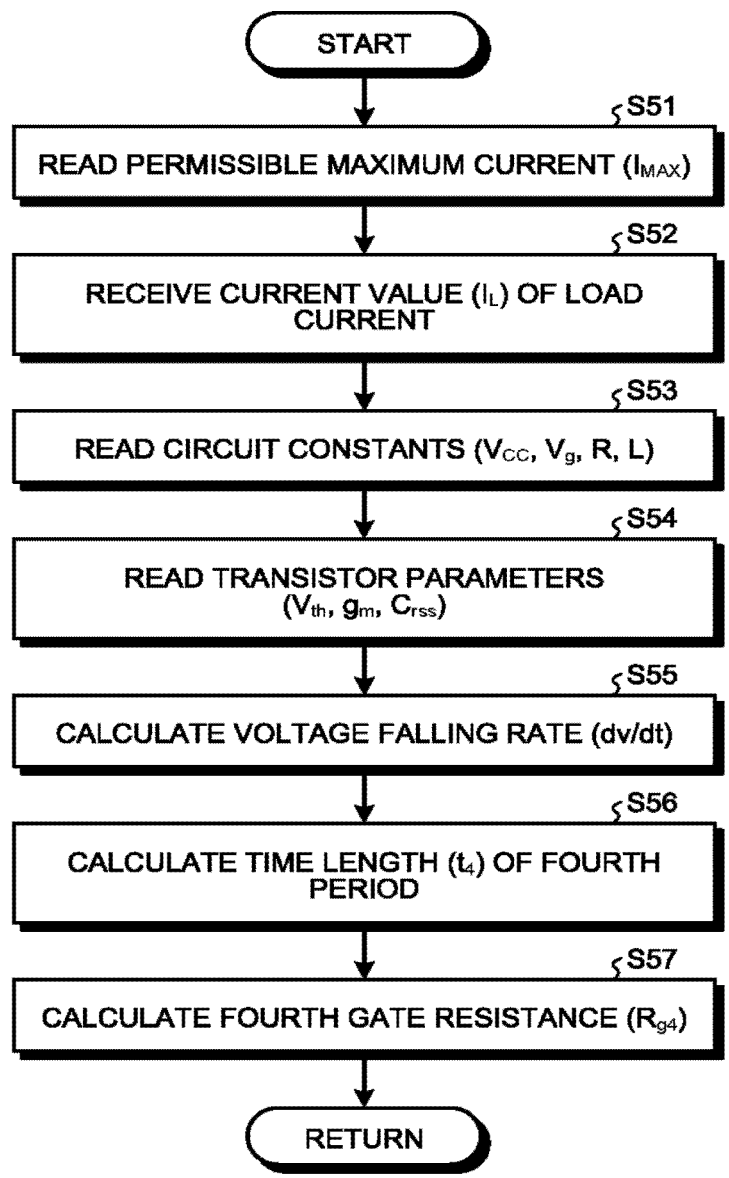
FIG. 13 is a schematic illustrating the sequence of a process for calculating the resistance of the gate resistor for a fourth period.

FIG. 13 is a flowchart illustrating the sequence of a process for calculating the gate resistance ($R_{g4}$) for the posterior half of the turn-on period (the fourth period $T_4$). The calculating unit 96 in the setting unit 30 performs the process illustrated in FIG. 13 at S15 in FIG. 9.

To begin with, at S51, the calculating unit 96 reads the permissible maximum current value ($I_{MAX}$) from the target value storage unit 82. At S52, the calculating unit 96 receives the current value ($I_L$) of the load current from the load current acquiring unit 84. At 353, the calculating unit 96 reads the voltage value ($V_{CC}$) of the power supply voltage, the voltage value ($V_g$) of the switching signal, the wiring resistance (R), and the wiring inductance (L) from the circuit constant storage unit 90. At S54, the calculating unit 96 reads the threshold voltage ($V_{th}$), the transconductance ($g_m$), and the gate-to-drain parasitic capacitance ($C_{rss}$) from the parameter storage unit 92.

At S55, the calculating unit 96 calculates a voltage falling rate (dv/dt) based on the permissible maximum current value ($I_{MAX}$), the current value ($I_L$) of the load current, the wiring resistance (R), and the wiring inductance (L). The voltage falling rate (dv/dt) is an amount by which the drain-to-source voltage value ($V_{DS}$) changes per unit time in the switching transistor 50. Specifically, the calculating unit 96 calculates Expression (18) below, where C is a drain-to-source parasitic capacitance of the switching transistor:

$$dv/dt = (I_{MAX} - I_L)/C \qquad (18)$$

At S56, the calculating unit 96 calculates a time length ($t_4$) of the fourth period $T_4$ based on the current value ($I_L$) of the load current and the current falling rate (di/dt). Specifically, the calculating unit 96 calculates Expression (19) below:

$$t_4 = V_{CC}/(dv/dt) \qquad (19)$$

At S57, the calculating unit 96 calculates the fourth gate resistance ($R_{g4}$) based on the time length ($t_4$) of the fourth period $T_4$, the current value ($I_L$) of the load current, the voltage value ($V_{CC}$) of the power supply voltage, the voltage value ($V_g$) of the switching signal, the threshold voltage value ($V_{th}$), the transconductance ($g_m$), and the gate-to-drain parasitic capacitance ($C_{rss}$). Specifically, the calculating unit 96 calculates the fourth gate resistance ($R_{g4}$) based on Expression (20) below:

$$R_{g4} = t_4 \cdot \frac{V_g - (V_{th} + I_L/g_m)}{C_{rss} \cdot V_{CC}} \qquad (20)$$

Expression (20) is derived from an expression modelling the MOSFET operation.

The calculating unit 96 ends this sequence once the process at S57 is finished. Through the process described above, the calculating unit 96 can calculate the gate resistance ($R_{g4}$) for the posterior half of the turn-on period (the fourth period $T_4$).

As described above, the power converter device 20 according to the embodiment can switch the gate resistance of the switching transistor 50 during the turn-off period and the turn-on period. In this manner, with the power converter device 20 according to the embodiment, the power loss and the surge voltage (or the current overshoot) can both be suppressed.

Furthermore, the power converter device 20 according to the embodiment calculates the gate resistance for each of the anterior half of the turn-off period, the posterior half of the turn-off period, the anterior half of the turn-on period, and the posterior half of the turn-on period using a current value of a load current, circuit constants, transistor parameters, and preset operational expressions. In this manner, with the power converter device 20 according to the embodiment, the gate resistance can be set to an appropriate value with a simple structure.

Figure 14:
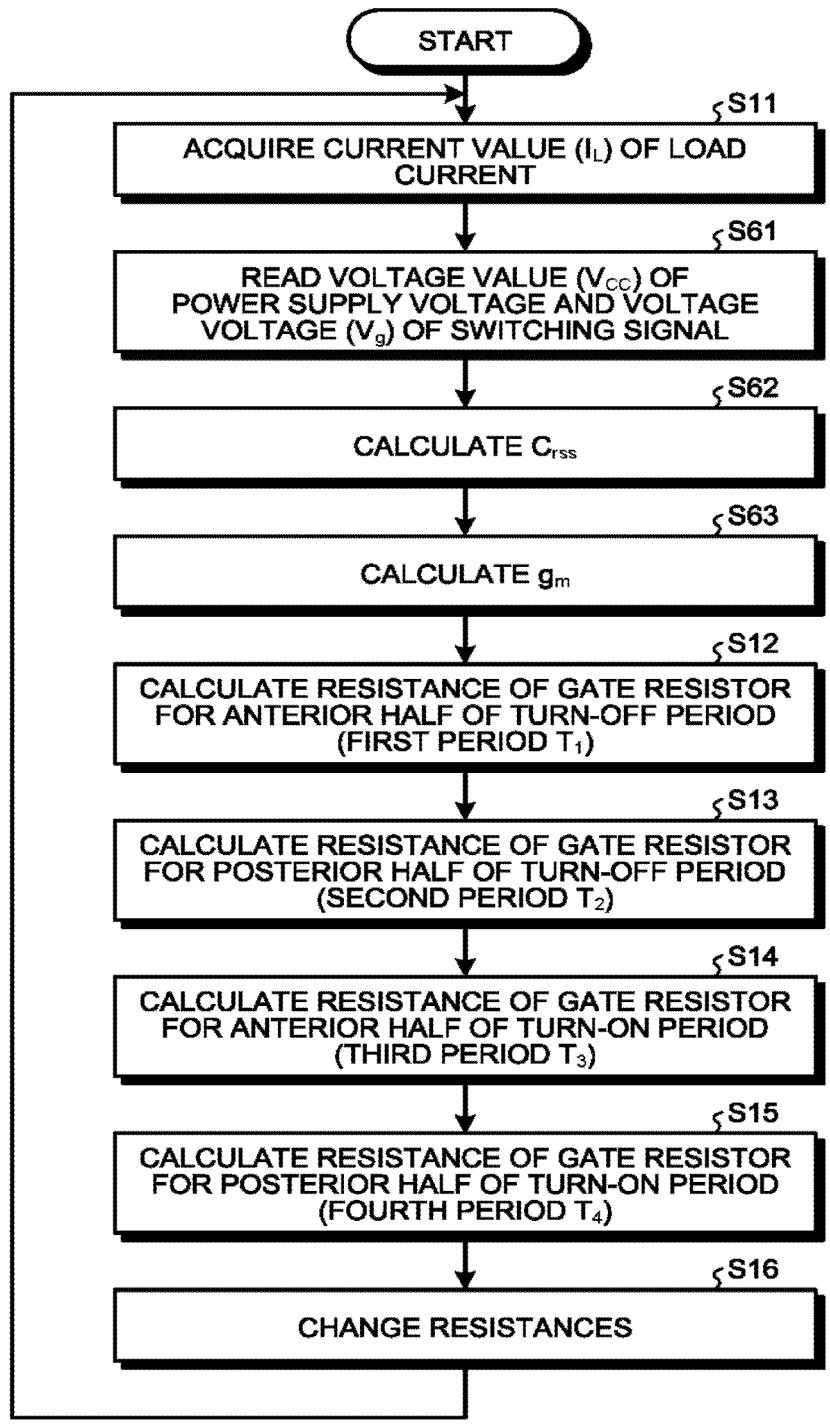
FIG. 14 is a flowchart illustrating the sequence of a process performed by the setting unit according to a first modification.

FIG. 14 is a flowchart illustrating the sequence of a process performed by the setting unit 30 according to a first modification. The setting unit 30 may also perform an operation following the flowchart illustrated in FIG. 14. The flowchart illustrated in FIG. 14 is substantially the same as the flowchart illustrated in FIG. 9. Therefore, the steps executing the same processes are assigned with the same step numbers, and detailed explanations thereof will be omitted.

The gate-to-drain parasitic capacitance ($C_{rss}$), which is one of the transistor parameters, has a characteristic that varies depending on the voltage value ($V_{CC}$) of the power supply voltage. The transconductance ($g_m$), which is another one of the transistor parameters, has a characteristic that varies depending on the voltage value ($V_g$) of the switching signal.

Therefore, the setting unit 30 stores a capacitance approximating function that represents a gate-to-drain parasitic capacitance ($C_{rss}$) with respect to a voltage value ($V_{CC}$) of the power supply voltage, in advance. For example, the setting unit 30 acquires measurements of gate-to-drain parasitic capacitance ($C_{rss}$) with a plurality of voltage values of the power supply voltage, and stores a first fitting function (e.g., a quadratic function) generated by applying a fitting process to the acquired measurement points, as the capacitance approximating function.

The setting unit 30 also stores a transconductance approximating function that represents a transconductance ($g_m$) with respect to a voltage value ($V_g$) of a switching signal voltage, in advance. For example, the setting unit 30 acquires measurements of transconductance ($g_m$) with a plurality of voltage values ($V_g$) of the switching signal, and stores a second fitting function (e.g., a quadratic function) generated by applying a fitting process to the acquired measurement points, as the transconductance approximating function.

The setting unit 30 then performs the operation by following the flowchart illustrated in FIG. 14 during the power conversion operation.

After acquiring the current value ($I_L$) of the load current at S11, the setting unit 30 shifts the process to S61. At S61, the setting unit 30 reads the voltage value ($V_{CC}$) of the power supply voltage and the voltage value ($V_g$) of the switching signal voltage from the circuit constant storage unit 90.

At S62, the setting unit 30 calculates a gate-to-drain parasitic capacitance ($C_{rss}$) based on the capacitance approximating function, which has been stored in advance, and the voltage value ($V_{CC}$) of the power supply voltage. At S63, the setting unit 30 calculates a transconductance ($g_m$) based on the transconductance approximating function, which has been stored in advance, and the voltage value ($V_g$) of the switching signal voltage. After completing S63, the setting unit 30 shifts the process to S12. The setting unit 30 then performs the same subsequent process as that illustrated in FIG. 9.

With such a setting unit 30 according to the first modification, the gate-to-drain parasitic capacitance ($C_{rss}$) and the transconductance ($g_m$) can be calculated accurately. In this manner, with the power converter device 20 according to the first modification, the gate resistance can be calculated accurately.

Figure 15:
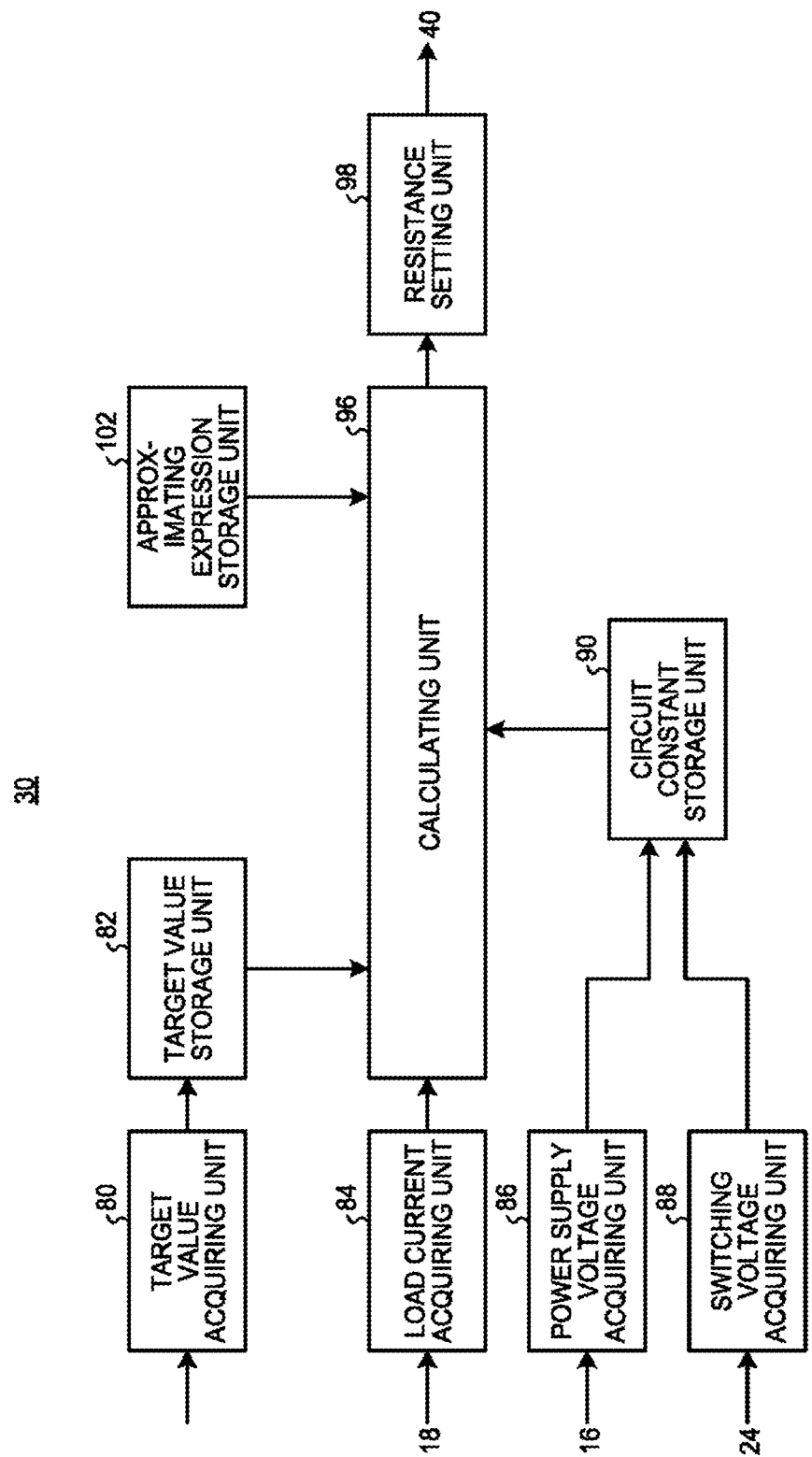
FIG. 15 is a block diagram illustrating a functional configuration of the setting unit according to a second modification.

FIG. 15 is a block diagram illustrating a functional configuration of the setting unit 30 according to a second modification. The setting unit 30 may include the blocks illustrated in FIG. 15. The block diagram illustrated in FIG. 15 is substantially the same as the block diagram illustrated in FIG. 8. Therefore, the elements having the same configurations are assigned with the same numbers, and detailed explanations thereof will be omitted.

The setting unit 30 may include an approximating expression storage unit 102 in replacement of the parameter storage unit 92 and the operational expression storage unit 94. The approximating expression storage unit 102 stores therein an operational expression for calculating the time length, and an approximating function for calculating the gate resistance, for each of the first period $T_1$, the second period $T_2$, the third period $T_3$, and the fourth period $T_4$.

The approximating function is a function that outputs a value using a current value ($I_L$) of a load current as a variable. For example, the approximating function is a function approximating a partial operational expression with the time length ($t_1$, $t_2$, $t_3$, $t_4$) in Expression (12), Expression (15), Expression (17), and Expression (20) excluded. In such a case, the voltage value ($V_{CC}$) of the power supply voltage and the voltage value ($V_g$) of the switching signal are fixed to predetermined values, and output values from the partial operational expression are calculated with a plurality of current values ($I_L$) of the load current. An approximating function is then generated by applying a fitting process to the output values, using a function of predetermined degree (e.g., a quadratic function), for example.

The approximating expression storage unit 102 may store an approximating function for each combination of one of a plurality of voltage values ($V_{CC}$) of the power supply voltage and one of a plurality of voltage values ($V_g$) of the switching signal voltage.

The calculating unit 96 substitutes the variable in the approximating function with the acquired current value ($I_L$) of the load current, and calculates a value corresponding to the partial operational expression. In this manner, the setting unit 30 can calculate an appropriate gate resistance with a simple operation.

Hardware Configuration

Figure 16:
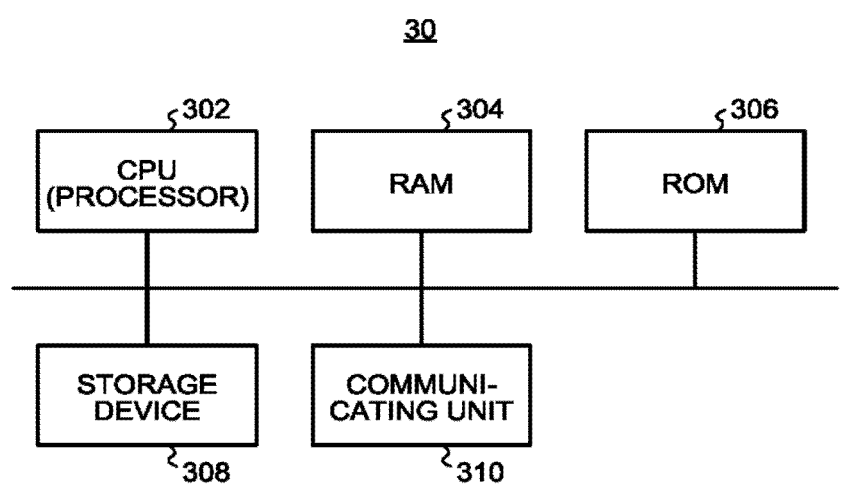
FIG. 16 is a block diagram illustrating a hardware configuration of the setting unit.

FIG. 16 is a block diagram illustrating a hardware configuration of the setting unit 30. The setting unit 30 according to the embodiment is implemented as an information processing circuit having a hardware configuration such as that illustrated in FIG. 16, and functions as a control apparatus. The setting unit 30 is provided with a central processing unit (CPU) 302, a random access memory (RAM) 304, a read-only memory (ROM) 306, a storage device 308, and a communicating unit 310. These units are then connected via a bus.

The CPU 302 is a processor that executes operations, control processes, and the like in accordance with a computer program. The CPU 302 performs various processes by cooperating with a computer program stored in the ROM 306, the storage device 308, or the like, using a predetermined area of the RAM 304 as a working area.

The RAM 304 is a memory such as a synchronous dynamic random access memory (SDRAM). The RAM 304 functions as a working area of the CPU 302. The ROM 306 is a memory that stores therein computer programs and various types of information in a rewritable manner.

The storage device 308 is a device that writes and reads data to and from a semiconductor storage medium such as a flash memory, or a storage medium magnetically or optically capable of recording. The storage device 308 writes and reads data to and from the storage medium, under the control of the CPU 302. The communicating unit 310 communicates with an external device over a network, under the control of the CPU 302.

The computer program executed by the setting unit 30 according to the embodiment has a modular structure including a target acquiring module, a load current acquiring module, a power supply voltage acquiring module, a switching voltage acquiring module, a calculating module, and a resistance settings module. This computer program causes the CPU 302 to function as the target value acquiring unit 80, the load current acquiring unit 84, the power supply voltage acquiring unit 86, the switching voltage acquiring unit 88, the calculating unit 96, and the resistance setting unit 98, by causing the CPU 302 (processor) to load the computer program onto the RAM 304, and to execute the computer program. Furthermore, this computer program also causes at least one of the RAM 304 and the storage device 308 to function as the target value storage unit 82, the parameter storage unit 92, and the operational expression storage unit 94.

Without limitation to such a configuration, the setting unit 30 may have a configuration in which at least a part of the target value acquiring unit 80, the load current acquiring unit 84, the power supply voltage acquiring unit 86, the switching voltage acquiring unit 88, the calculating unit 96, and the resistance setting unit 98 is implemented as a hardware circuit (such as a semiconductor integrated circuit).

Furthermore, the computer program executed by the setting unit 30 according to the embodiment is provided in a manner recorded in a computer-readable recording medium such as a compact disc read-only memory (CD-ROM), a flexible disk, a compact disc recordable (CD-R), or a digital versatile disc (DVD), as a file having a computer-installable or -executable format.

Furthermore, the computer program executed by the setting unit 30 according to the embodiment may be stored in a computer connected to a network such as the Internet, and made available for downloads over a network. Furthermore, the computer program executed by the setting unit 30 according to the embodiment may also be provided or distributed over a network such as the Internet. Furthermore, the computer program executed by the setting unit 30 may be provided in a manner incorporated in the ROM 306 or the like in advance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A switching device comprising:
   a switching transistor that is switched on and off in response to a switching signal;
   a gate resistor unit that includes a first resistor and a second resistor each of which has a variable resistance;
   a switching control unit that connects the first resistor between an input terminal for receiving the switching signal and a gate of the switching transistor during a first period that is an anterior half of a turn-off period of the switching transistor, and connects the second resistor between the input terminal and the gate during a second period that is a posterior half of the turn-off period;
   a target value acquiring unit that acquires a target voltage rising rate and a permissible maximum voltage value of the switching transistor;
   a calculating unit that calculates a first gate resistance that is a resistance between the input terminal and the gate for the first period based on the target voltage rising rate and a first operational expression, and that calculates a second gate resistance that is a resistance between the input terminal and the gate for the second period based on the permissible maximum voltage value and a second operational expression; and
   a resistance setting unit that sets resistances of the first resistor and the second resistor based on the first gate resistance and the second gate resistance.

2. The device according to claim 1, further comprising a load current acquiring unit that acquires a current value of a load current that is output from the switching transistor when the switching transistor is on, wherein
   the calculating unit calculates the first gate resistance and the second gate resistance further based on the current value of the load current.

3. The device according to claim 2, further comprising a power supply voltage acquiring unit that acquires a voltage value of a power supply voltage that is applied to the switching transistor, wherein
   the calculating unit calculates the first gate resistance and the second gate resistance further based on the voltage value of the power supply voltage.

4. The device according to claim 3, wherein the switching control unit switches a resistor connected between the input terminal and the gate from the first resistor to the second resistor at a timing at which a drain-to-source voltage value of the switching transistor reaches the voltage value of the power supply voltage for the first time.

5. The device according to claim 4, wherein the calculating unit calculates a time length of the first period based on the target voltage rising rate and the voltage value of the power supply voltage, and calculates the first gate resistance based on a following expression (1):

$$R_{g1} = t_1 \cdot \frac{(I_L/g_m + V_{th})}{C_{rss} \cdot V_{CC}} \tag{1}$$

where $R_{g1}$ denotes the first gate resistance,
$t_1$ denotes the time length of the first period,
$I_L$ denotes the current value of the load current, $V_{CC}$ denotes the voltage value of the power supply voltage, $V_{th}$ denotes a threshold voltage value of the switching transistor, $g_m$ denotes a transconductance of the switching transistor, and $C_{rss}$ denotes a gate-to-drain parasitic capacitance of the switching transistor.

6. The device according to claim 5, wherein the calculating unit calculates a time length of the second period based on the permissible maximum voltage value, the voltage value of the power supply voltage, the current value of the load current, and a wiring inductance of a wiring through which the load current flows, and calculates the second gate resistance based on a following expression (2):

$$R_{g2} = t_2 \cdot \frac{1}{(C_{gs} + C_{rss}) \cdot \ln\left(\frac{I_L}{g_m \cdot V_{th}} + 1\right)} \qquad (2)$$

where $R_{g2}$ denotes the second gate resistance, $t_2$ denotes the time length of the second period, and $C_{gs}$ denotes a gate-to-source parasitic capacitance of the switching transistor.

7. The device according to claim 3, wherein the gate resistor unit further includes a third resistor and a fourth resistor each of which has a variable resistance, the switching control unit connects the third resistor between the input terminal and the gate during a third period that is an anterior half of a turn-on period of the switching transistor, and connects the fourth resistor between the input terminal and the gate during a fourth period that is a posterior half of the turn-on period, the target value acquiring unit acquires a target current rising rate and a permissible maximum current value of the switching transistor, the calculating unit calculates a third gate resistance that is a resistance between the input terminal and the gate for the third period based on the target current rising rate and a third operational expression, and calculates a fourth gate resistance that is a resistance between the input terminal and the gate for the fourth period based on the permissible maximum current value and a fourth operational expression, and the resistance setting unit sets resistances of the third resistor and the fourth resistor based on the third gate resistance and the fourth gate resistance.

8. The device according to claim 7, further comprising a switching voltage acquiring unit that acquires a voltage value of a switching signal, wherein the calculating unit calculates the third gate resistance and the fourth gate resistance further based on the current value of the load current, the voltage value of the power supply voltage, and the voltage value of the switching signal.

9. The device according to claim 8, wherein the switching control unit switches a resistor connected between the input terminal and the gate from the third resistor to the fourth resistor at a timing at which a current value flowing through a drain of the switching transistor reaches a current value of the load current for the first time.

10. The device according to claim 9, wherein the calculating unit calculates a time length of the third period based on the target current rising rate and the current value of the load current, and calculates the third gate resistance based on a following expression (3):

$$R_{g3} = t_3 \cdot \frac{1}{(C_{gs} + C_{rss}) \cdot \ln\left(\frac{g_m \cdot V_g}{g_m \cdot (V_g - V_{th}) - I_L}\right)} \qquad (3)$$

where $R_{g3}$ denotes the third gate resistance, $t_3$ denotes the time length of the third period, $I_L$ denotes the current value of the load current, $V_g$ denotes the voltage value of the switching signal, $V_{th}$ denotes a threshold voltage value of the switching transistor, $g_m$ denotes a transconductance of the switching transistor, $C_{rss}$ denotes a gate-to-drain parasitic capacitance of the switching transistor, and $C_{gs}$ denotes a gate-to-source parasitic capacitance of the switching transistor.

11. The device according to claim 10, wherein the calculating unit calculates a time length of the fourth period based on the permissible maximum current, the voltage value of the power supply voltage, the current value of the load current, a wiring inductance of a wiring through which the load current flows, and a wiring resistance of the wiring through which the load current flows, and calculates the fourth gate resistance based on a following expression (4):

$$R_{g4} = t_4 \cdot \frac{V_g - (V_{th} + I_L/g_m)}{C_{rss} \cdot V_{CC}} \qquad (4)$$

where $R_{g4}$ denotes the fourth gate resistance, $t_4$ denotes the time length of the fourth period, and $V_{CC}$ denotes the voltage value of the power supply voltage.

12. The device according to claim 5, wherein the calculating unit calculates the gate-to-drain parasitic capacitance based on a preset function in which the power supply voltage is a variable.

13. The device according to claim 5, wherein the calculating unit calculates the transconductance based on a preset function in which the voltage value of the switching signal is a variable.

14. The device according to claim 2, wherein the calculating unit calculates the first gate resistance based on a preset first fitting function in which the current value of the load current is a variable, and calculates the second gate resistance based on a preset second fitting function in which the current value of the load current is a variable.

15. A switching device comprising:

a switching transistor that is switched on and off in response to a switching signal;

a gate resistor unit that includes a third resistor and a fourth resistor each of which has a variable resistance;

a switching control unit that connects the third resistor between an input terminal for receiving the switching signal and a gate of the switching transistor during a third period that is an anterior half of a turn-on period of the switching transistor, and that connects the fourth resistor between the input terminal and the gate during a fourth period that is a posterior half of the turn-on period;

a target value acquiring unit that acquires a target current rising rate and a permissible maximum current value;

a calculating unit that calculates a third gate resistance that is a resistance between the input terminal and the gate for the third period based on the target current rising rate and a third operational expression, and that calculates a fourth gate resistance that is a resistance between the input terminal and the gate for the fourth period based on the permissible maximum current value and a fourth operational expression; and a resistance setting unit that sets resistances of the third resistor and the fourth resistor based on the third gate resistance and the fourth gate resistance.

16. A power converter device for supplying power output from a power supply to a load, the power converter device comprising:

the switching device according to claim 1; and a driving control unit that switches on and off the switching transistor by feeding the switching signal to the switching transistor, wherein the switching device supplies a current to the load by switching a voltage output from the power supply in accordance with the switching signal.

17. A control apparatus configured to set a first resistance and a second resistance to a switch unit that comprises:

a switching transistor that is switched on and off in response to a switching signal;

a gate resistor unit that includes a first resistor and a second resistor each of which has a variable resistance; and a switching control unit that connects the first resistor between an input terminal for receiving the switching signal and a gate of the switching transistor during a first period that is an anterior half of a turn-off period of the switching transistor, and connects the second resistor between the input terminal and the gate during a second period that is a posterior half of the turn-off period, wherein the control apparatus comprises:

a target value acquiring unit that acquires a target voltage rising rate and a permissible maximum voltage value;

a calculating unit that calculates a first gate resistance that is a resistance between the input terminal and the gate for the first period based on the target voltage rising rate and a first operational expression, and that calculates a second gate resistance that is a resistance between the input terminal and the gate for the second period based on the permissible maximum voltage value and a second operational expression; and a resistance setting unit that sets resistances of the first resistor and the second resistor based on the first gate resistance and the second gate resistance.

18. A computer program product having a computer readable medium including programmed instructions, wherein a control apparatus is configured to set a first resistor and a second resistor to a switch unit that comprises:

a switching transistor that is switched on and off in response to a switching signal;

a gate resistor unit that includes a first resistor and a second resistor each of which has a variable resistance; and a switching control unit that connects the first resistor between an input terminal for receiving the switching signal and a gate of the switching transistor during a first period that is an anterior half of a turn-off period of the switching transistor, and that connects the second resistor between the input terminal and the gate during a second period that is a posterior half of the turn-off period, and the instructions cause a computer of the control apparatus to execute:

acquiring a target voltage rising rate and a permissible maximum voltage value;

calculating a first gate resistance that is a resistance between the input terminal and the gate for the first period based on the target voltage rising rate and a first operational expression;

calculating a second gate resistance that is a resistance between the input terminal and the gate for the second period based on the permissible maximum voltage value and a second operational expression; and setting resistances of the first resistor and the second resistor based on the first gate resistance and the second gate resistance.

* * * * *